United States Patent
Kim

(10) Patent No.: US 7,212,052 B2
(45) Date of Patent: May 1, 2007

(54) JITTER SUPPRESSING DELAY LOCKED LOOP CIRCUITS AND RELATED METHODS

(75) Inventor: Kyu-Hyoun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 10/925,522

(22) Filed: Aug. 25, 2004

(65) Prior Publication Data

US 2005/0088211 A1    Apr. 28, 2005

(30) Foreign Application Priority Data

Oct. 24, 2003   (KR) ...................... 10-2003-0074677

(51) Int. Cl.
*H03L 7/06*   (2006.01)

(52) U.S. Cl. ....................... 327/158; 327/159; 327/161

(58) Field of Classification Search ..................... None
See application file for complete search history.

(56) References Cited

U.S. PATENT DOCUMENTS

| | | | | |
|---|---|---|---|---|
| 4,809,209 A | * | 2/1989 | White ........................ | 708/319 |
| 5,554,945 A | * | 9/1996 | Lee et al. .................... | 327/105 |
| 5,717,619 A | * | 2/1998 | Spurbeck et al. ........... | 708/319 |
| 6,125,157 A | * | 9/2000 | Donnelly et al. ........... | 375/371 |
| 6,677,793 B1 | * | 1/2004 | Chan et al. ................. | 327/158 |
| 6,794,912 B2 | * | 9/2004 | Hirata et al. ................ | 327/158 |
| 6,854,002 B2 | * | 2/2005 | Conway et al. ............. | 708/313 |
| 2005/0052211 A1 | * | 3/2005 | Jung et al. .................. | 327/277 |

* cited by examiner

*Primary Examiner*—Timothy P. Callahan
*Assistant Examiner*—An T. Luu
(74) *Attorney, Agent, or Firm*—Myers Bigel Sibley & Sajovec

(57) ABSTRACT

Delay locked loop circuits are provided that include a delay locked loop that generates a delay locked loop output signal and a jitter suppressor. The jitter suppressor may comprise a delay circuit that receives the delay locked loop output signal and generates one or more delayed versions of the delay locked loop output signal and a phase interpolator that receives the delay locked loop output signal and the one or more delayed versions of the delay locked loop output signal. In certain embodiments of the present invention, the delay circuit may comprise a plurality of serially connected delay cells. Each of these delay cells may delay signals input thereto for at time equal to one clock period of an external clock signal that is input to the delay locked loop.

20 Claims, 4 Drawing Sheets

JITTER SUPPRESSING DELAY LOCKED LOOP CIRCUITS AND RELATED METHODS

RELATED APPLICATIONS

This application claims priority under 35 U.S.C. § 119 to Korean Patent Application No. 2003-74677, filed on Oct. 24, 2003, the entire content of which is incorporated herein by reference.

FIELD OF THE INVENTION

The present invention relates to a semiconductor integrated circuit, and more particularly, to a delay locked loop circuit.

BACKGROUND OF THE INVENTION

Delay locked loop circuits are circuits that may be used to generate an internal clock signal that has a phase that leads a reference clock signal by a predetermined time. Internal clock signals are often used in semiconductor integrated circuits which operate in synchronization with an external clock signal and have a relatively high degree of integration such as, for example, Rambus DRAM (RDRAM) and Synchronous DRAM (SDRAM) circuits.

More specifically, in many conventional semiconductor circuits, an external clock signal is input to a clock buffer through an input pin to generate an internal clock signal. A data output buffer outputs data to an external circuit in synchronization with the internal clock signal. The internal clock signal is delayed from the external clock signal by a predetermined time in the clock buffer. The output data from the data output buffer is also delayed from the internal clock signal by a predetermined time. As a result, the output data may be output after a long delay time with respect to the external clock signal such that the output data access time (tAC) becomes long.

In order to reduce the output data access time (tAC), a delay locked loop may be used to generate the internal clock signal such that the phase of the internal clock signal leads the phase of the external clock signal by a predetermined time. Use of such an internal clock signal may allow the output data to be output without delay with respect to the external clock signal. In other words, the delay locked loop receives the external clock signal and generates an internal clock signal that has a phase that leads the external clock signal by a predetermined time. The internal clock signal may be used as a clock signal of each part of the circuit, such as the data output buffer.

FIG. 1 is a block diagram of a conventional delay locked loop circuit 100. As shown in FIG. 1, the conventional delay locked loop includes a phase detector 11, a charge pump 12, and a voltage controlled delay line 13.

SUMMARY OF THE INVENTION

Pursuant to embodiments of the present invention, delay locked loop circuits are provided that include (1) a delay locked loop that generates a delay locked loop output signal, (2) a delay circuit that receives the delay locked loop output signal and generates one or more delayed versions of the delay locked loop output signal and (3) a phase interpolator that receives the delay locked loop output signal and the one or more delayed versions of the delay locked loop output signal. In certain embodiments of the present invention, the delay circuit may comprise a plurality of serially connected delay cells. Each of these delay cells may delay signals input thereto for at time equal to one clock period of an external clock signal that is input to the delay locked loop.

In these delay locked loop circuits, the phase interpolator may be configured to interpolate the phase of the delay locked loop output signal and the phases of the one or more delayed versions of the delay locked loop output signal to generate an internal clock signal. These circuits may also include a first weighting circuit that is configured to weight the phases of the delay locked loop output signal and the one or more delayed versions of the delay locked loop output signal before the delay locked loop output signal and the one or more versions of the delay locked loop output signal are received by the phase interpolator.

In certain embodiments of the present invention, the delay locked loop may include a phase detector that compares the phase of an external clock signal and the phase of the delay locked loop output signal. In other embodiments, the delay locked loop may further include a second weighting circuit that is configured to weight the phases of the delay locked loop output signal and the one or more delayed versions of the delay locked loop output signal and a second phase interpolator that is configured to interpolate the phases of the delay locked loop output signal and the one or more delayed versions of the delay locked loop output signal that are weighted by the second weighting circuit. In these embodiments, the delay locked loop may include a phase detector that compares the phase of an external clock signal and an output of the second phase interpolator.

According to further embodiments of the present invention, delayed locked loop circuits for generating an internal clock signal having a phase that leads an external clock signal by a predetermined time are provided which include a delayed lock loop and a jitter suppressor circuit. In these circuits, the delay locked loop may include a phase detector that is configured to compare the phases of the external clock signal and a second signal and a voltage controlled delay line that is configured to produce a delayed version of the external clock signal, wherein the magnitude of the delay is based on the output of the phase detector. The jitter suppressor may include a variable delay unit that is configured to receive the delayed version of the external clock signal and generate a plurality of variable delay unit output signals and a first phase interpolator that is configured to interpolate phases of the delayed version of the external clock signal and at least some of the plurality of variable delay unit output signals to generate the internal clock signal. The delay locked loop may also include a first weighting circuit coupled between the variable delay unit and the first phase interpolator that is configured to weigh the phases of at least some of the delayed version of the external clock signal and the plurality of variable delay unit output signals so that at least some of the signals input to the first phase interpolator comprise phase weighted signals.

In certain of these embodiments, the second signal may be the delayed version of the external clock signal. In other embodiments, the delay locked loop circuit may further include a second weighting circuit that is coupled between the variable delay unit and the first phase interpolator that is configured to weight the phases of at least some of the delayed version of the external clock signal and the plurality of variable delay unit output signals to produce a plurality of phase weighted output signals and a second phase interpolator that is configured to interpolate the phase weighted output signals of the second weighting circuit to produce a second phase interpolated output signal. In such embodiments, the second signal may be the second phase interpolated output signal.

Pursuant to still further embodiments of the present invention, methods of generating an internal clock signal from an external clock signal are provided. Pursuant to these methods, the external clock signal is input to a delay locked loop to produce a preliminary internal clock signal, and a plurality of delayed versions of the preliminary internal clock signal are then produced. The phases of the preliminary internal clock signal and the plurality of delayed versions of the preliminary internal clock signal are then weighted using a first set of weights to produce a plurality of phase weighted signals, and the phases of the phase weighted signals are interpolated to generate the internal clock signal.

BRIEF DESCRIPTION OF THE DRAWINGS

The accompanying drawings, which are included to provide a further understanding of the invention, and which are incorporated in and constitute a part of this application, illustrate certain embodiments of the invention and together with the description serve to explain the principle of the invention. In the drawings.

DETAILED DESCRIPTION

Figure 1:
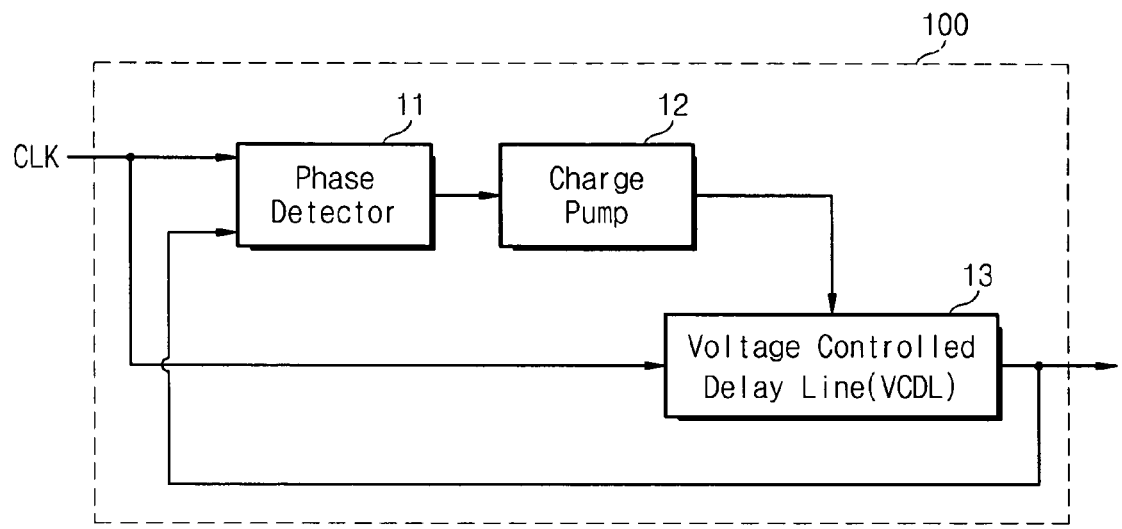
FIG. 1 is a block diagram of a conventional delay locked loop.

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 2:
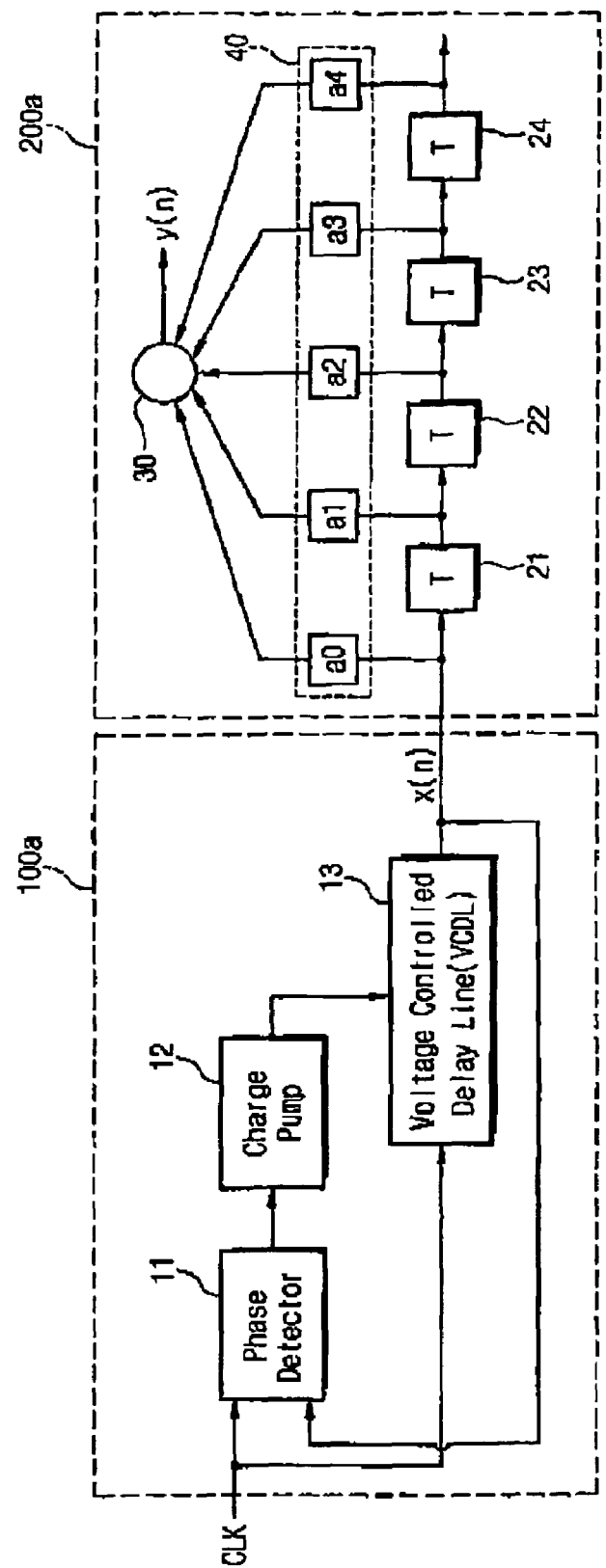
FIG. 2 is a block diagram of a delay locked loop circuit having a jitter suppressor according to certain embodiments of the present invention.

FIG. 2 is a block diagram of a delay locked loop circuit having a jitter suppressor according to certain embodiments of the present invention. As shown in FIG. 2, the circuit includes a delay locked loop 100a and a jitter suppressor 200a.

The delay locked loop 100a in the embodiment of FIG. 2 may have a structure that is identical to the structure of the conventional delay locked loop 100 illustrated in FIG. 1. That is, the delay locked loop 100a may include a phase detector 11, a charge pump 12, and a voltage controlled delay line (VCDL) 13.

As shown in FIG. 2, the phase detector 11 compares the phase of an input external clock signal CLK with the phase of the fed-back output clock signal of the delay locked loop 100a, and outputs the result as a detection signal to the charge pump 12. The charge pump 12 converts the output signal of the phase detector 11 into a voltage signal using capacitors. The voltage controlled delay line 13 receives the external clock signal CLK and delays the external clock signal CLK by a delay time that corresponds to the output voltage signal of the charge pump 12. The voltage controlled delay line 13 then outputs the delayed clock signal as the internal clock signal. As noted above, the output signal of the voltage controlled delay line 13 is also fed-back to serve as one of the inputs to the phase detector 11.

The external clock signal CLK that comprises the input signal to the delay locked loop circuit may contain jitter. If the jitter is not suppressed, it may degrade the performance of the semiconductor device, particularly as the input/output frequency is increased.

As is also shown in FIG. 2, the jitter suppressor 200a includes a variable delay unit and a phase interpolator 30. The variable delay unit is connected in series with the output terminal of the delay locked loop 100a and delays the output signal of the delay locked loop 100a by a predetermined time. As shown in FIG. 2, the variable delay unit may comprise a plurality of serially connected delay cells 21, 22, 23 and 24, each of which delay the signal input to the delay cell by one clock cycle T. As can be seen in FIG. 2, the phase interpolator 30 receives the output signal from the delay locked loop 100a and the delayed signals from the delay cells 21, 22, 23 and 24 of the variable delay unit and interpolates their phases. The phases are interpolated with assignment of weights a0, a1, a2, a3 and a4. The weighting circuit 40 that applies the weights may be part of the phase interpolator, part of the delay unit, and/or implemented as separate circuit elements. It will be understood that, as used herein, the term "weighting circuit" is intended to encompass all such embodiments. The weighting circuit 40 is configured to weight the phases of the delay locked loop output signal and the one or more delayed versions of the delay locked loop output signal before the delay locked loop output signal and the one or more versions of the delay locked loop output signal are received by the phase interpolator 30. The delay locked loop circuit generates a weighted average value by interpolating the weighted phases of the current output signal and the output signals of k prior clock cycles (in FIG. 2, k=4). This can be expressed as an equation below:

$$Y(z)=(a0+a1 \times z+a2 \times z^2+a3 \times z^3+\ldots) \times X(z) \qquad \text{(Eq. 1)}$$

In Equation 1, $X(z)$ represents the jitter of the input clock signal $x(n)$ and $Y(z)$ represents the jitter of the final output signal $y(n)$. If the input clock signal has alternating positive and negative jitter, that is, if $x(n)$ has the jitter shown in FIG. 3A, the jitter can be substantially removed from $y(n)$ by making $Y(z)=(1+z) \times X(z)$, that is, $y(n)=x(n)+x(n-1)$.

Figure 3A:
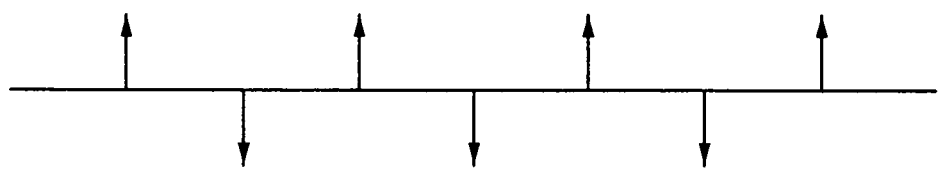
FIGS. 3A and 3B illustrate examples of jitter that may occur in a delay locked loop circuit.
Figure 3B:
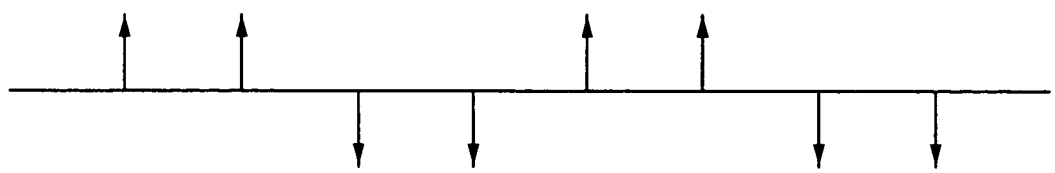

In another example, if $x(n)$ has the jitter shown in FIG. 3B, the jitter can be substantially removed from $y(n)$ by making $Y(z)=(1+z^2) \times X(z)$, that is, $y(n)=x(n)+x(n-2)$.

As still another example, the jitter shown in both FIGS. 3A and 3B can be substantially eliminated by making $Y(z)=(1+z) \times (1+z^2) \times X(z)=(1+z+z^2+z^3) \times X(z)$, that is, $y(n)=x(n)+x(n-1)+x(n-2)+x(n-3)$.

As illustrated by the above examples, if the interpolation weights $a0, a1, \ldots, ak$ are properly selected, the jitter of the final output signal from the delay locked loop circuit with respect to the arbitrary input jitters can be reduced, minimized or eliminated altogether.

Figure 4:
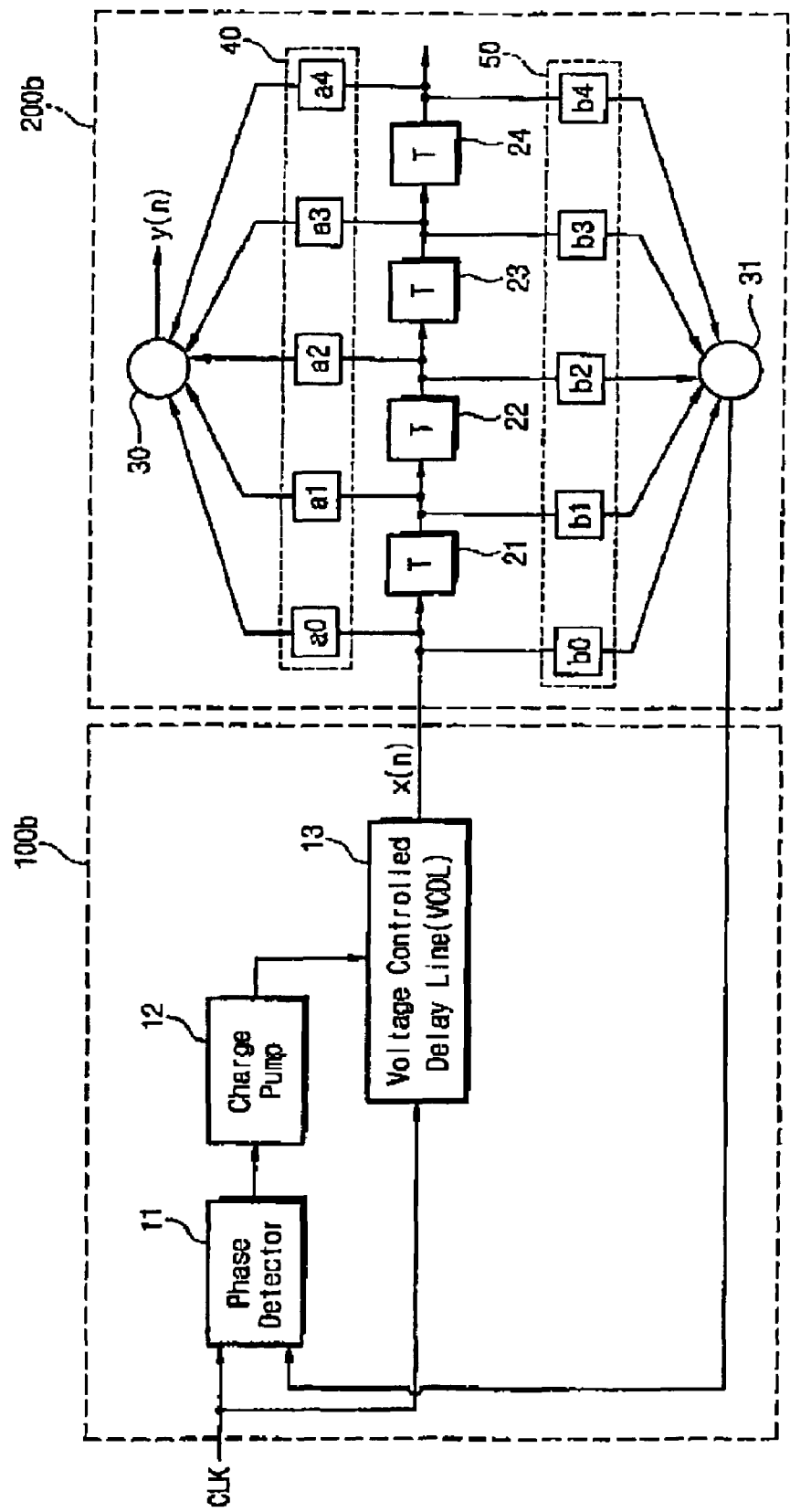
FIG. 4 is a block diagram of a delay locked loop circuit having a jitter suppressor according to further embodiments of the present invention.

FIG. 4 is a block diagram of a delay locked loop circuit having a jitter suppressor according to further embodiments of the present invention. The delay locked loop circuit depicted in FIG. 4 generates several signals that are provided by sequentially delaying the output signal of the conventional delay locked loop 100b by clock period T. The jitter suppressor circuit 200b, then interpolates the phases of all of these signals, operating in a similar manner as the jitter suppressor circuit 200a of FIG. 2. A first weighting circuit 40 is configured to weight the phases of the delay locked loop output signal and the one or more delayed versions of the delay locked loop output signal before the delay locked loop output signal and the one or more versions of the delay locked loop output signal are received by the phase interpolator 30. The delay locked loop circuit of FIG. 4 further includes a second phase interpolator 31 that interpolates phases with interpolation weights of b0, b1, b2, b3 and b4 provided by a second weighting circuit 50. As shown in FIG. 4, the output signal of the second phase interpolator 31 is fed back to the input terminal of the phase detector 11 of the delay locked loop 100b and compared with the phase of the input clock signal. This is in contrast to the embodiment depicted in FIG. 2, in which the output signal of the delay locked loop 100a is fed back to the phase detector 11 and compared with the phase of the input clock signal.

The relation between the input jitter and output jitter of the delay locked loop circuit of FIG. 4 can be expressed as follows:

$$Y(z) = \frac{a0 + a1 \times z + a2 \times z^2 + a3 \times z^3 + \ldots}{b0 + b1 \times z + b2 \times z^2 + b3 \times z^3 + \ldots} X(z) \qquad \text{(Eq. 2)}$$

As described above, the present invention has an advantage that can suppress the jitter occurring in the delay locking.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A delay locked loop circuit for generating an internal clock signal, comprising:
    a delay locked loop that generates a delay locked loop output signal;
    a delay circuit that receives the delay locked loop output signal and generates one or more delayed versions of the delay locked loop output signal;
    a phase interpolator that receives the delay locked loop output signal and the one or more delayed versions of the delay locked loop output signal;
    wherein the delay circuit includes a plurality of delay cells that are connected in series and the time delay associated with each of the delay cells is equal to one clock period of an external clock signal that is input to the delay locked loop.

2. The delay locked loop circuit of claim 1, wherein the phase interpolator is configured to interpolate the phase of the delay locked loop output signal and the phases of the one or more delayed versions of the delay locked loop output signal to generate the internal clock signal.

3. The delay locked loop circuit of claim 1, further comprising a first weighting circuit that is configured to weight the phases of the delay locked loop output signal and the one or more delayed versions of the delay locked loop output signal before the delay locked loop output signal and the one or more versions of the delay locked loop output signal are received by the phase interpolator.

4. The delay locked loop circuit of claim 3, further comprising:
    a second weighting circuit that is configured to weight the phases of the delay locked loop output signal and the one or more delayed versions of the delay locked loop output signal; and
    a second phase interpolator that is configured to interpolate the phases of the delay locked loop output signal and the one or more delayed versions of the delay locked loop output signal that are weighted by the second weighting circuit.

5. The delay locked loop circuit of claim 4, wherein the delay locked loop includes a phase detector that compares the phase of an external clock signal and an output of the second phase interpolator.

6. A delayed locked loop circuit for generating an internal clock signal having a phase that leads an external clock signal by a predetermined time, the delay locked loop circuit comprising:
    a delay locked loop comprising:
        a phase detector that is configured to compare the phases of the external clock signal and a second signal;
        a voltage controlled delay line that is configured to produce a delayed version of the external clock signal, wherein a magnitude of the delay is based on the output of the phase detector;
    a jitter suppressor comprising:
        a variable delay unit that is configured to receive the delayed version of the external clock signal and generate a plurality of variable delay unit output signals;
        a first phase interpolator that is configured to interpolate phases of the delayed version of the external clock signal and at least some of the plurality of variable delay unit output signals to generate the internal clock signal; and a first weighting circuit coupled between the variable delay unit and the first phase interpolator that is configured to weigh the phases of at least some of the delayed version of the external clock signal and the plurality of variable delay unit output signals so that at least some of the signals input to the first phase interpolator comprise phase weighted signals.

7. The delay locked loop circuit of claim 6, further comprising:

a second weighting circuit coupled between the variable delay unit and the first phase interpolator that is configured to weigh the phases of the delayed version of the external clock signal and the variable delay unit output signals to produce a plurality of phase weighted output signals; and a second phase interpolator that is configured to interpolate the phase weighted output signals of the second weighting circuit to produce a second phase interpolated output signal;

wherein the second signal comprises the second phase interpolated output signal.

8. A delayed locked loop circuit for generating an internal clock signal having a phase that leads an external clock signal by a predetermined time, the delay locked loop circuit comprising:

a delay locked loop comprising:

a phase detector that is configured to compare the phases of the external clock signal and a second signal;

a voltage controlled delay line that is configured to produce a delayed version of the external clock signal, wherein a magnitude of the delay is based on the output of the phase detector;

a jitter suppressor comprising:

a variable delay unit that is configured to receive the delayed version of the external clock signal and generate a plurality of variable delay unit output signals; and a first phase interpolator that is configured to interpolate phases of the delayed version of the external clock signal and at least two of the plurality of variable delay unit output signals to generate the internal clock signal, wherein the variable delay unit includes a plurality of delay cells that are connected in series, and wherein the time delay associated with each of the delay cells is equal to one clock period of the external clock signal.

9. A delayed locked loop circuit for generating an internal clock signal having a phase that leads an external clock signal by a predetermined time, comprising:

a delay locked loop including a phase detector configured to compare phases of an external clock signal and a fed-back clock signal; and a multi-output variable delay unit that is configured to receive an output signal from the delay locked loop and produce a plurality of delayed versions of the output signal; and a first phase interpolator that is configured to receive and interpolate phases of the output signal from the delay locked loop and at least some of the delayed versions of the output signal from the delay locked loop to produce the internal clock signal; and a second phase interpolator that is configured to interpolate phases of the output signal from the delay locked loop and at least some of the delayed versions of the output signal from the delay locked loop to generate the fed-back clock signal.

10. The delay locked loop circuit of claim 9, wherein the variable delay unit further comprises:

a first weighting circuit that weights at least some of the output signal from the delay locked loop and the delayed versions of the output signal from the delay locked loop so that at least some of the signals received by the first phase interpolator comprise phase weighted signals; and a second weighting circuit that weights at least some of the output signal from the delay locked loop and the delayed versions of the output signal from the delay locked loop so that at least some of the signals received by the second phase interpolator comprise phase weighted signals;

wherein at least some of the weights applied by the first weighting circuit and the second weighting circuit are different.

11. A method of generating an internal clock signal from an external clock signal, the method comprising:

inputting the external clock signal to a delay locked loop to produce a preliminary internal clock signal;

producing a plurality of delayed versions of the preliminary internal clock signal;

weighting the phases of the preliminary internal clock signal and the plurality of delayed versions of the preliminary internal clock signal using a first set of weights to produce a plurality of phase weighted signals; and interpolating the phases of the phase weighted signals to generate the internal clock signal.

12. The method of claim 11, wherein the delay locked loop comprises a phase detector that receives the external clock signal and a second signal, a charge pump that receives an output from the phase detector, and a voltage controlled delay line that receives and delays the external clock signal by an amount that is based on the output of the charge pump to generate the preliminary internal clock signal.

13. The method of claim 12, wherein the second signal comprises the preliminary internal clock signal.

14. The method of claim 12, further comprising:

weighting the phases of the preliminary internal clock signal and the plurality of delayed versions of the preliminary internal clock signal using a second set of weights to produce a second plurality of phase weighted signals; and interpolating the phases of the second plurality of phase weighted signals to generate the second signal.

15. The method of claim 11, wherein producing a plurality of delayed versions of the preliminary internal clock signal comprises feeding the preliminary internal clock signal through a plurality of delay cells.

16. The method of claim 15, wherein each of the delay cells delays the preliminary internal clock signal by one cycle of the external clock signal.

17. A method of suppressing jitter in an output signal from a delay locked loop, the method comprising:

receiving the output signal from the delay locked loop;

producing a plurality of delayed versions of the output signal;

interpolating the phases of the output signal and at least two of the plurality of delayed versions of the output signal to generate a jitter suppressed output signal; and weighting the phases of the output signal and the plurality of delayed versions of the output signal using a first set of weights to produce a plurality of phase weighted signals, wherein interpolating the phases of the output signal and at least some of the plurality of delayed versions of the output signal to generate the jitter suppressed output signal comprises performing a weighted interpolation of the phases of the output signal and at least some of the plurality of delayed versions of the output signal to generate the jitter suppressed output signal.

18. The method of claim 17, wherein the delay locked loop comprises a phase detector that receives an external clock signal and a second signal, a charge pump that receives an output from the phase detector, and a voltage controlled delay line that receives and delays the external clock signal by an amount that is based on the output of the charge pump to generate the output signal.

19. The method of claim 18, wherein the second signal comprises the output signal.

20. The method of claim 18, further comprising:

weighting the phases of the output signal and the plurality of delayed versions of the output signal using a second set of weights to produce a second plurality of phase weighted signals; and interpolating the phases of the second plurality of phase weighted signals to generate the second signal.

* * * * *